United States Patent [19]

Kitamura et al.

[11] Patent Number: 5,461,259
[45] Date of Patent: Oct. 24, 1995

[54] HIGH-CURRENT INTEGRATED CIRCUIT

[75] Inventors: Akio Kitamura; Yukio Yano, both of Kawasaki, Japan

[73] Assignee: Fuji Electric Co., Ltd., Kanagawa, Japan

[21] Appl. No.: 22,520

[22] Filed: Feb. 25, 1993

[30] Foreign Application Priority Data

Feb. 28, 1992 [JP] Japan ................................. 4-043605

[51] Int. Cl.$^6$ .......................... H01L 27/10; H01L 23/48; H01L 29/735
[52] U.S. Cl. .................... 257/758; 257/401; 257/776
[58] Field of Search ................................ 257/208, 211, 257/370, 390, 391, 393, 401, 758, 385, 776

[56] References Cited

U.S. PATENT DOCUMENTS

| | | | |
|---|---|---|---|
| 4,962,058 | 10/1990 | Cronin et al. | 257/758 |
| 5,025,299 | 6/1991 | Arnould | 257/758 |
| 5,047,825 | 9/1991 | Yasaka et al. | 257/211 |
| 5,184,202 | 2/1993 | Uchida | 257/390 |

FOREIGN PATENT DOCUMENTS

| | | | |
|---|---|---|---|
| 0121973 | 7/1984 | Japan | 257/390 |
| 0239647 | 9/1990 | Japan | 257/758 |

Primary Examiner—Robert P. Limanek
Assistant Examiner—Alexander Oscar Williams
Attorney, Agent, or Firm—Spencer, Frank & Schneider; Christopher H. Lynt

[57] ABSTRACT

Collective transistors in a high-current IC are arranged in the column and row directions on a substrate, with each row having two collective transistors. The collective transistors are connected in a multi-phase half bridge circuit by wiring conductors which extend in the row direction and by a pair of wiring conductors which extend in the column direction. Each wiring conductor in the row direction includes a top conductive layer which is positioned over a first one of the collective transistors in the respective row and a bottom conductive layer which is positioned over the second collective transistor in the respective row, the top and bottom conductive layers being connected to one another through a connecting hole in an interlayer insulation film. One of the wiring conductors which extends in the column direction includes a bottom conductive layer which is positioned above the first collective transistor and the other wiring conductor which extends in the column direction includes a top conductive layer which is positioned over the second collective transistor.

13 Claims, 8 Drawing Sheets

HIGH-CURRENT INTEGRATED CIRCUIT

BACKGROUND OF THE INVENTION

1. Field of the Invention

The present invention relates to wiring structures for high-current integrated circuits (IC's) equipped with n-phase half bridge circuits, and in particular to a technique for forming wiring in transistor-forming regions.

2. Description of the Prior Art

The recent achievement of miniaturization, cost-saving, high-functionalization and high reliability in the fields of, for instance, FA and OA machinery and tools, has greatly depended on the improvement of various components in size, functions and quality, and further development thereof has been anticipated. For instance, the size of hard disk devices installed in personal computers or the like will certainly be reduced to the 2.5 to 1.8 inch-size within several years. It would be required that the driving and control parts be formed on a single chip and that a driving part capable of processing a current of higher than 1A be developed, for LSI's used in such hard disk devices. Therefore, it is necessary to design an arrangement of transistor-forming regions and wiring structures while taking into consideration the aforementioned circumstances since the ON-state resistance for high-current IC's such as IC's for controlling disk drives is an important factor for defining, for instance, a correlation between the magnitude of the current to be processed and the size thereof.

An example of such a high-current IC which satisfies the requirement is a circuit having a wiring structure as shown in FIG. 1. This circuit shown in FIG. 1 is an IC equipped with a three-phase half bridge circuit for driving and controlling a three-phase motor. FIG. 2 is a circuit diagram of this circuit.

In these figures, there are arranged, in the form of a lattice in the column and row directions, paired transistors, which comprise collective transistors 201 to 203 in first to third phases and collective transistors 204 to 206 in the first to third phases. They are covered with an interlayer insulation film 110. The collective transistors 201 to 203, which are hereafter simply called "transistors" 201 to 203, are arranged on the high side of the circuit, while the collective transistors 204 to 206, which are hereafter simply called "transistors" 204 to 206, are arranged on the low side thereof. FIG. 3 shows the structure of the circuit in cross-section. The transistors are formed by diffusing ions in the surface region of a semiconductor-substrate 100 and the surface thereof is covered with interlayer insulation film 110 as has been discussed above. A plurality of through holes (connecting holes) 110a are formed through interlayer insulation film 110. Top and bottom wiring conductors, as will be explained below, are connected to the corresponding electrode regions of each collective transistor formed on the substrate 110 through the connecting holes 110a in such a way that a source is connected to other sources and a drain is connected to other drains in each collective transistor, and the wiring between the collective transistors is as shown in FIG. 2. Transistors 201 to 203 and transistors 204 to 206 are hereinafter referred to as "high side transistors 201 to 203" and "low side transistors 204 to 206" respectively. A wiring conductor 209, which is depicted with a dot-dash line in FIG. 1, is provided for the first phase output and is arranged in the row direction. Wiring conductor 209 is connected to the source regions of high side transistor 201 and to the drain regions of low side transistor 204 in the first phase. Wiring conductor 209 is provided with a pad 214 for the first phase output at the edge thereof. Wiring conductors 210 and 211, which are also depicted with dot-dash chain lines in FIG. 1, are provided for the second and third phase outputs. Wiring conductors 210 and 211 are respectively connected to the source regions of high side transistors 202 and 203 and to the drain regions of low side transistors 205 and 206 in the second and third phases, and are provided with pads 215 and 216 for the second and third phase outputs at the edges thereof. In addition, a high side common terminal wiring conductor 208, depicted with a double-dot-dash chain line in FIG. 1, extends in the column direction and is conductively connected to the drain regions of high side transistors 201 to 203. Wiring conductor 208 is provided with a pad 212 for the high side common terminal at the edge thereof. A low side common terminal wiring conductor 207 is arranged in the column direction and is conductively connected to the source regions of low side transistors 204 to 206. Wiring conductor 207 is provided with a pad 213 for the low side common terminal at the edge thereof. Each wiring conductor is formed and positioned within the space formed by etching interlayer insulation film 110. Thus, in interlayer insulation film 110, common terminal wiring conductors 207 and 208 constitute the upper side or top wiring layers of a crossed and multilayered wiring structure with respect to wiring conductors 209 to 211 for the first to third outputs. FIG. 4 shows a perspective view of the lower side or bottom wiring conductors 209–211 in the wiring structure. As is shown in FIG. 4, the bottom wiring conductors are formed all over except the vicinity of through holes 110a of interlayer insulation film 110. Therefore, the wiring of the bottom wiring conductors is connected conductively while avoiding the vicinity of through holes 110a. Due to such a structure, the distance needed for each of the first to third phase wiring conductors 209 to 211 and each of the common terminal wiring conductors 207 and 208 can be reduced and the resistance of the wiring conductors can correspondingly be lowered. This accordingly makes it possible to reduce the On-state resistance.

In the foregoing wiring structure, however, bottom wiring conductors 209 to 211 and top wiring conductors 207 and 208 are formed on the surface of the semiconductor substrate in a high density manner and thus occupy a wide surface area thereof. This makes it difficult to form new wiring conductors in the vicinity of the regions for forming the first to third phase high side transistors 201 to 203 and the first to third phase low side transistors 204 to 206, and this greatly limits the degree of freedom for circuit-design of large-scale IC's. The circuit-design is greatly restricted. For instance, the surface area of a semiconductor substrate existing between the elements, i.e., between the first to third phase high side transistors 201 to 203 and first to third phase low side transistors 204 to 206, is covered with wiring conductors 209 to 211 for the first to third phase outputs or the bottom wiring layers and, therefore, isolation contacts cannot be formed on the region existing between these elements. In this case, only one conductive connection which can be selected freely is obtained if one wishes to reverse the source and drain connections with respect to the higher or lower wiring layer.

Moreover, bottom wiring conductors 209 to 211 for the first to third phase outputs and the common terminal wiring conductors (the top wiring conductors) 207 and 208 constitute a crossed and multilayered wiring structure above each transistor-forming region. As shown in FIG. 3, for example, in order to connect the drain of transistor 201 to top wiring conductor 208, the drain should be first connected to the bottom layer, and connected to top wiring conductor 208 via a through hole 110a. In the conventional circuit structure, as described above, when the source of high side transistor 201 is connected to the bottom wiring conductor, the drain next to the source is connected to the top wiring conductor. Therefore, when the source contact area is larger than the drain contact area, since the source of low side transistor 204 must be connected to top wiring conductor 207, the wiring width of the connecting portion of bottom wiring conductor 209 to the drain is reduced, and the wiring resistance of the connecting portion is increased.

SUMMARY OF THE INVENTION

Accordingly, an object of the present invention is to provide a novel wiring structure usable in a high-current IC having a crossed and multilayered wiring structure, which permits arrangement of other additional wiring layers between transistor-forming regions.

Another object of the present invention is to provide a novel wiring structure which can be connected to sources and drains selectively by way of a first layer or a second layer, and can reduce the wiring resistance.

According to a first aspect of the present invention, the foregoing objects can be accomplished by providing a high-current integrated circuit which comprises:

pairs of transistors formed in a surface of a semiconductor and consisting of high side transistors on a high side and low side transistors on a low side, the transistors on the high side and transistors on the low side composing an n-phase half bridge circuit and the pairs of transistors being arranged in a row direction and a column direction, and the number of pairs of transistors arranged in the column direction being n;

an interlayer insulation film covering the transistors;

a wiring conductor for output formed for each phase of the bridge circuit, the wiring conductor extending along the row direction and being conductively connected to one side of electrode regions of the transistor on the high side and of the transistor on the low side; and a high side common terminal conductor layer and a low side common terminal conductor layer extending along the column direction and being conductively connected to the other side of the electrode regions of corresponding transistors; wherein, the wiring conductor for output and the common wiring conductors form a crossed, multilayered wiring structure via the interlayer insulation film; and one of the wiring conductors for output, the high side common terminal wiring conductor and the low side common terminal wiring conductor in each phase is formed over one of two neighboring transistor-forming regions as an upper side or top conductive layer, while, over the other of the transistor-forming regions, the one of the three wiring conductors is formed as a lower side or bottom conductive layer and conductively connected to the top layer through a connecting hole which is formed through the interlayer insulation film in the vicinity of the transistor-forming regions.

Here, one of the remaining wiring conductors among the wiring conductors for output, the high side common terminal wiring conductor and the low side common terminal wiring conductor in each phase may be formed as bottom conductive layers over both of two neighboring transistor-forming regions, a conductive layer for connection may be formed on the surface side of the interlayer insulation film between these transistor-forming regions, and each of the bottom layers may be connected to the layer for connection through connecting holes formed through the interlayer insulation film in the vicinity of the transistor-forming regions.

According to a second aspect of the present invention, a high-current integrated circuit comprises:

pairs of transistors formed in a surface of a semiconductor and consisting of high side transistors on a high side and low side transistors on a low side, the transistors on the high side and transistors on the low side composing an n-phase half bridge circuit and the pairs of transistors being arranged in a row direction and a column direction, and the number of pairs of the transistors arranged in the column direction being n;

an interlayer insulation film covering the transistors;

a wiring conductor for output formed for each phase of the bridge circuit, the wiring conductor extending along the row direction and being conductively connected to one side of electrode regions of the transistor on the high side and of the transistor on the low side; and a high side common terminal wiring conductor and a low side common terminal wiring conductor extending along the column direction and being conductively connected to another side of the electrode regions of corresponding transistors;

the wiring conductor for output and the common wiring conductors forming a crossed, multilayered wiring structure via the interlayer insulation film; and one of the wiring conductor for output, the high side common terminal wiring conductor, and the low side common terminal wiring conductor in each phase being formed as a lower side or bottom conductive layer over both of two neighboring transistor-forming regions, a conductive layer for connection being formed on the surface side of the interlayer insulation film formed between these transistor-forming regions, and each of the bottom conductive layers being connected to the conductive layer for connection through connecting holes formed through the interlayer insulation film in the vicinity of the transistor-forming regions.

Here, one of the remaining wiring conductors among the wiring conductor for output, the high side common terminal wiring conductor, and the low side common terminal wiring conductor in each phase may be formed over one of two neighboring transistor-forming regions as an upper side or top conductive layer while, over the other of the transistor-forming regions, it is formed as a lower side or bottom conductive layer and is connected to the top conductive layer through a connecting hole which is formed through the interlayer insulation film in the vicinity of one of the transistor-forming regions.

In the high-current IC according to the first aspect, wherein the wiring conductor for output, the high side common terminal wiring conductor, or the low side common terminal wiring conductor in each phase is formed over one of two neighboring transistor-forming regions as a top conductive layer while, over the other of the transistor-forming regions, it is formed as a bottom conductive layer and is connected to the top conductive layer through a connecting hole which is formed through the interlayer insulation film in the vicinity of one of the transistor-forming regions, the conductive layer formed over the one of the transistor-forming regions as the top conductive layer extends to the region near the other of the transistor-forming regions and is connected to the bottom conductive layer through the connecting hole formed through the interlayer insulation film in the vicinity of the other of the transistor-forming regions. For this reason, in these two neighboring transistor-forming regions, the bottom conductive layer is not present adjacent the one side of the transistor-forming regions and only exists in the vicinity of the other of the transistor-forming regions. Therefore, it is also possible to ensure more reliable insulation-separation of these transistors by, for instance, forming an isolation contact between the neighboring transistor-forming regions. This results in a high degree of freedom for circuit-design.

In the high-current IC according to the second aspect, wherein the wiring conductor for output, the high side common terminal wiring conductor, or the low side common terminal wiring conductor in each phase is formed as a bottom conductive layer over both of two neighboring transistor-forming regions, these bottom conductive layers are connected through a crosslink provided by the conductive layer for connection, which is formed between the transistor-forming regions on the surface of the interlayer insulation film. For this reason, in the region existing between these transistor-forming regions, a bottom conductive layer is not present below the conductive layer for connection, and bottom conductive layers exist only in the vicinity of the transistor-forming regions. Therefore, it is also possible to ensure more reliable insulation-separation of these transistor-forming regions by, for instance, forming an isolation contact between the two neighboring transistor-forming regions while maintaining short distances required for leading the wiring conductor for output, the high side common terminal wiring conductor, and the low side common terminal wiring conductor in each phase.

This results in a high degree of freedom for circuit-design.

Moreover, in both of these high-current IC's according to the first and second aspects of the present invention, the bottom conductive layers extend to the positions for forming the connecting holes through the interlayer insulation film in the vicinity of the transistor-forming regions. For this reason, above the surface of a transistor-forming region, the top conductive layer does not limit the positions for connecting the corresponding transistor to the bottom conductive layer or vice versa, and they can thus be conductively connected while securing a wide area on either of the sides of the electrode regions of the corresponding transistor. This allows a reduction of the wiring resistance at the connected portions.

That is to say, in one of the transistor-forming regions, since it is possible to connect each of the source and the drain to either the top conductive layer or the bottom conductive layer, it is possible to selectively form each wiring of the source and the drain so as to reduce the wiring resistance.

The above and other objects, effects, features and advantages of the present invention will become more apparent from the following description of embodiments thereof taken in conjunction with the accompanying drawings.

DETAILED DESCRIPTION OF THE PREFERRED EMBODIMENTS

An embodiment according to the present invention will be explained below with reference to the accompanying drawings.

Figure 1:
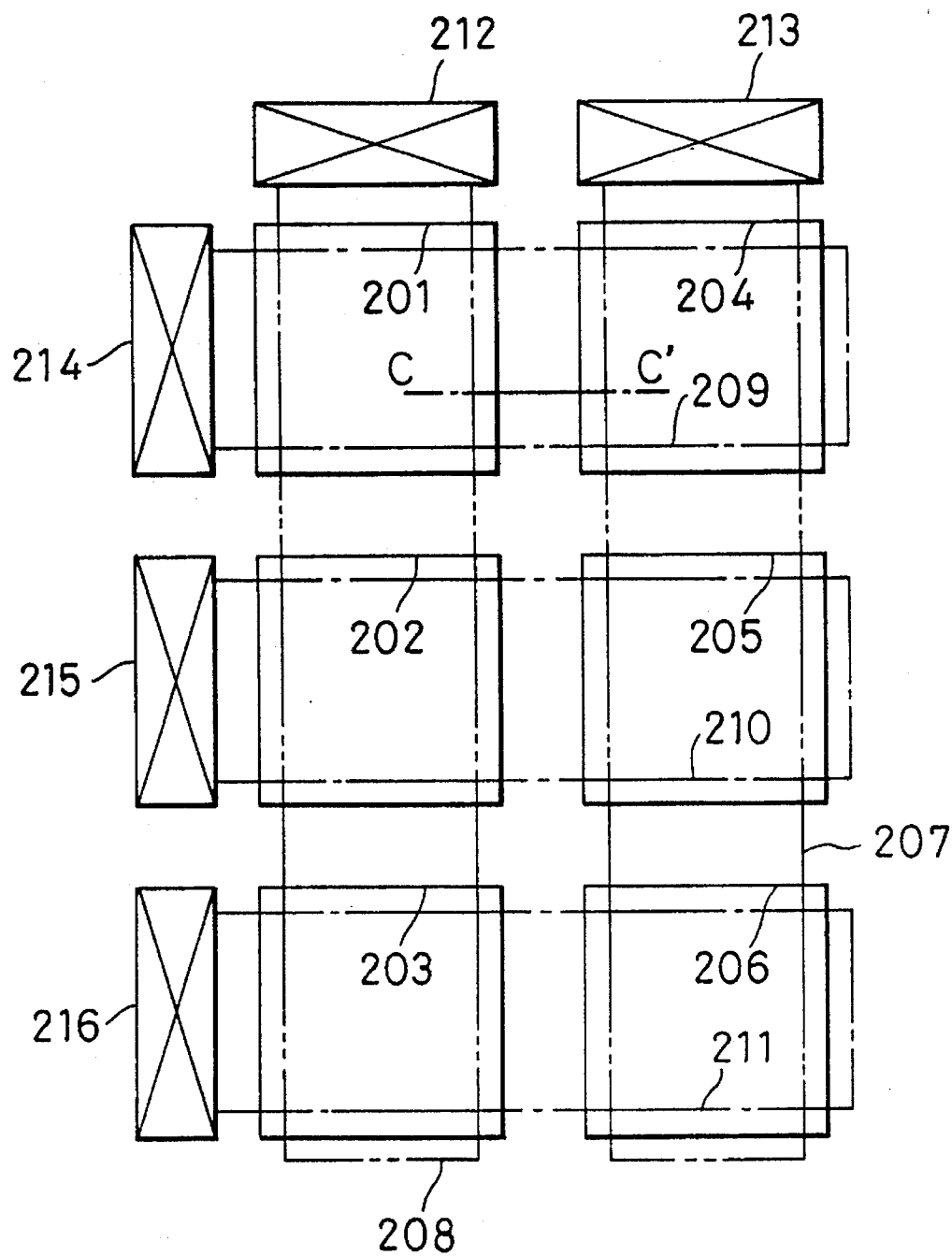
FIG. 1 is a schematic plan view showing principal parts of a conventional high-current IC.
Figure 2:
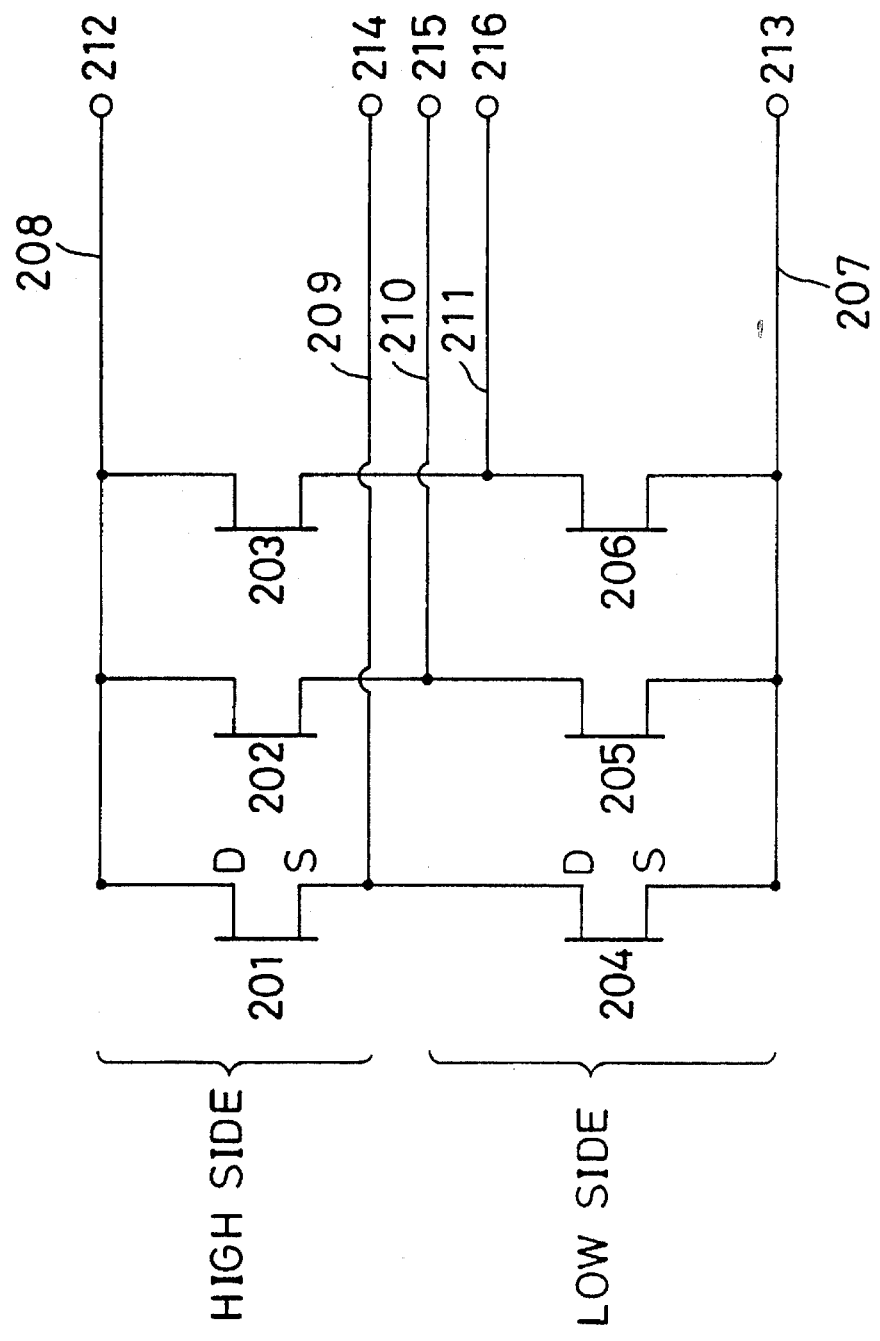
FIG. 2 is a circuit diagram showing the conventional high-current IC as shown in FIG. 1.
Figure 3:
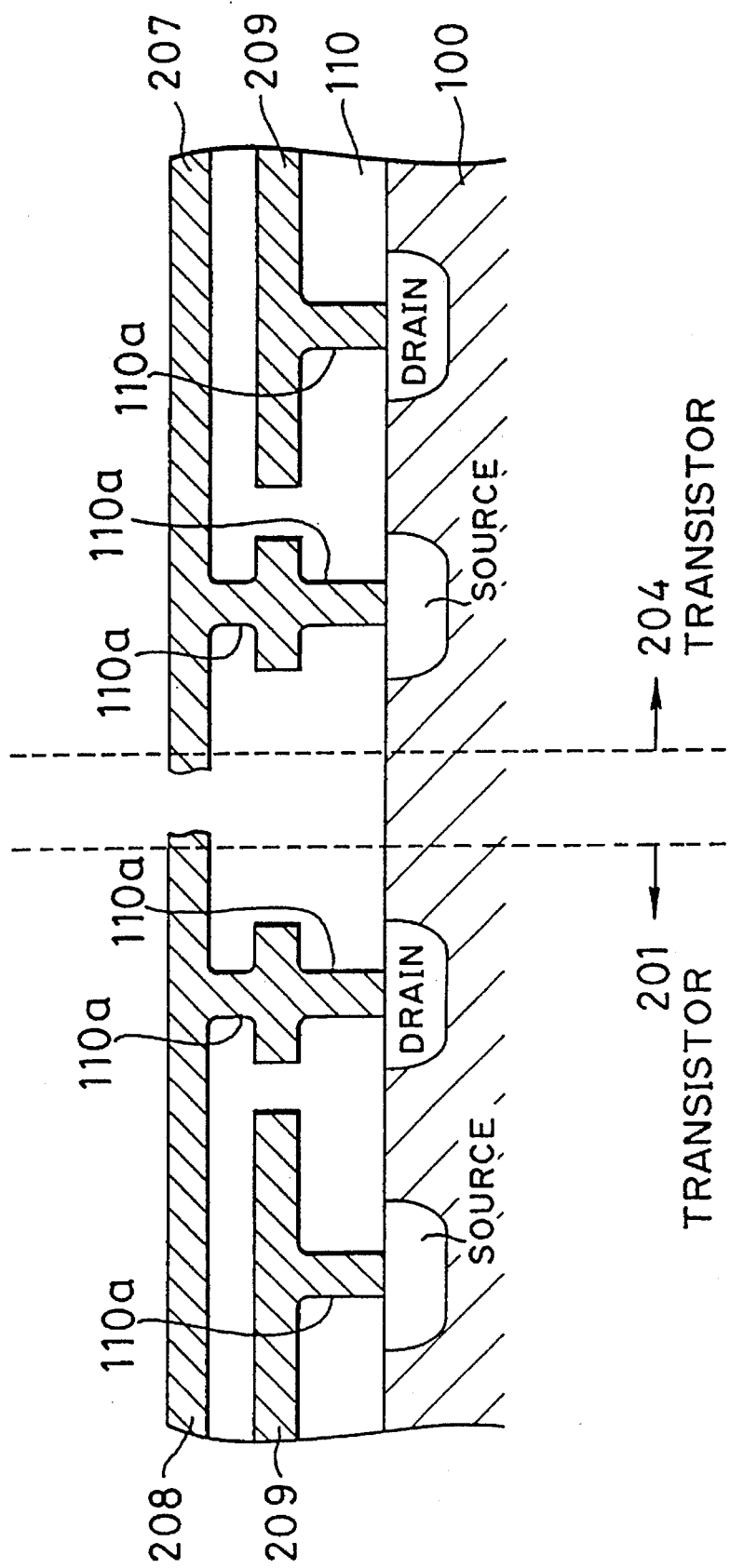
FIG. 3 is a schematic cross sectional view showing the high-current IC shown in FIG. 1 taken along the line C—C' on FIG. 1.
Figure 4:
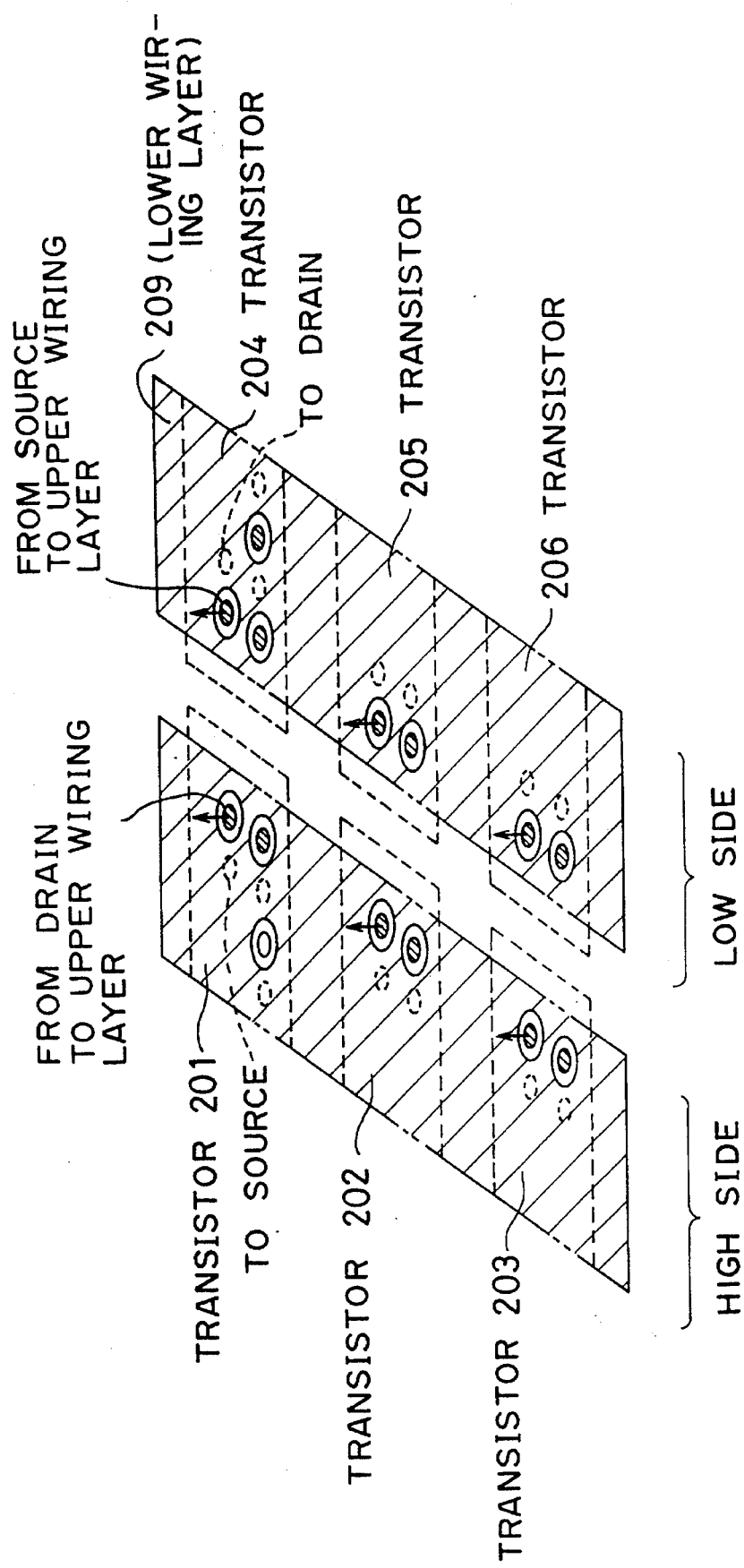
FIG. 4 is a perspective view showing only the bottom conductive layer of the high-current IC shown in FIG. 1.
Figure 5:
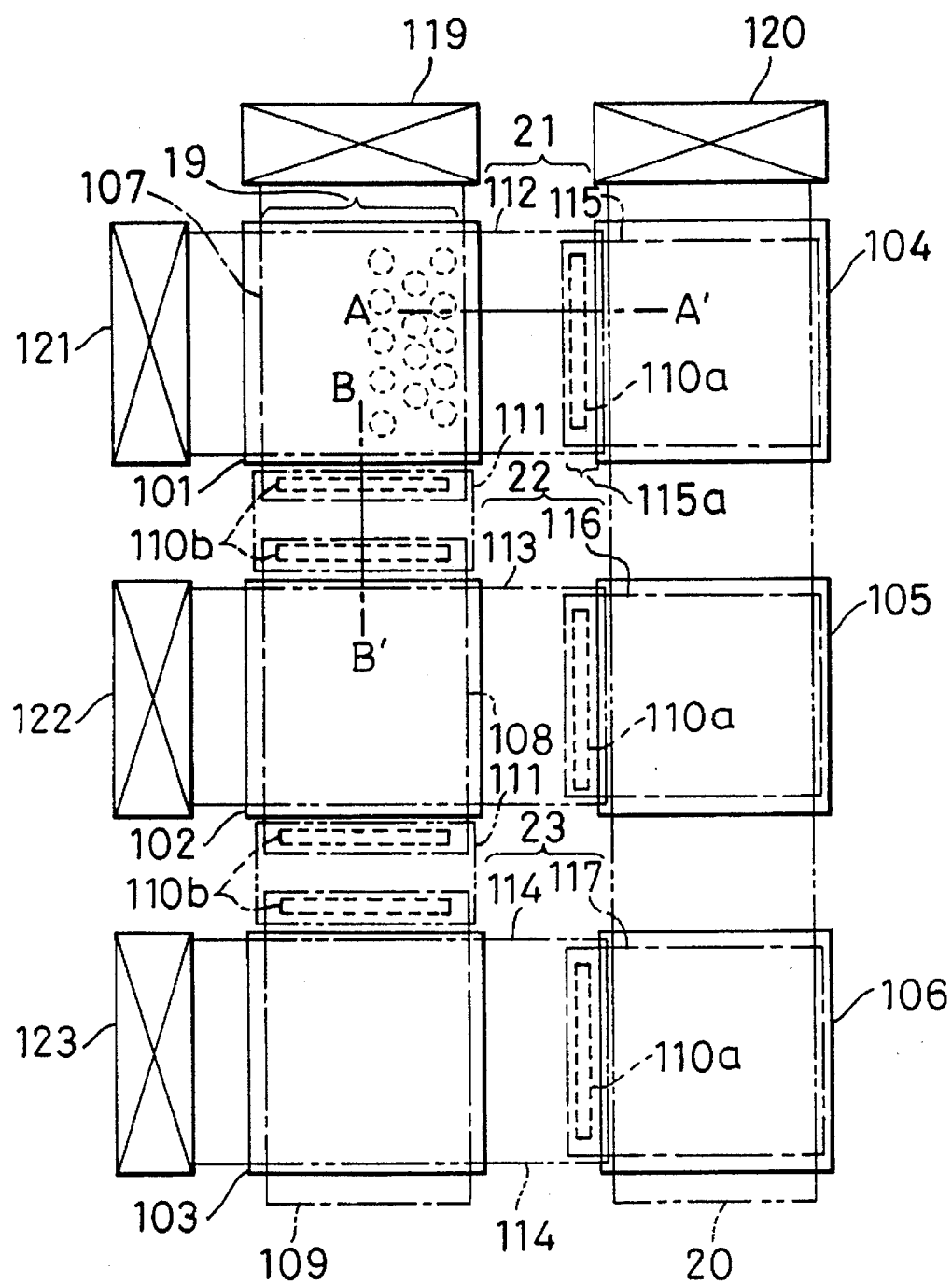
FIG. 5 is a schematic plan view showing principal parts of an embodiment of the high-current IC according to the present invention.

FIG. 5 is a schematic plan view showing the wiring structure of part of a high current IC for controlling a hard disk drive. This IC chip is provided with a three-phase half bridge circuit. In this figure, conductive layers shown by dot-dash chain lines (alternate long and short segments) are lower side or bottom layers of aluminum formed at the lower side of an interlayer insulation film 110 on a semiconductor substrate, and conductive layers represented by double-dot-dash chain lines are upper side or top layers of aluminum formed at the upper side of interlayer insulation film 110.

As seen from this figure, first to third phase low side transistors 101 to 103 and first to third phase high side transistors 104 to 106 are arranged in pairs, each of which comprises a low side transistor and a high side transistor arranged in the row direction. The pairs of transistors are arranged in the column direction in such a manner that the high side transistors are adjacent to each other and the low side transistors are adjacent to each other.

Figure 6:
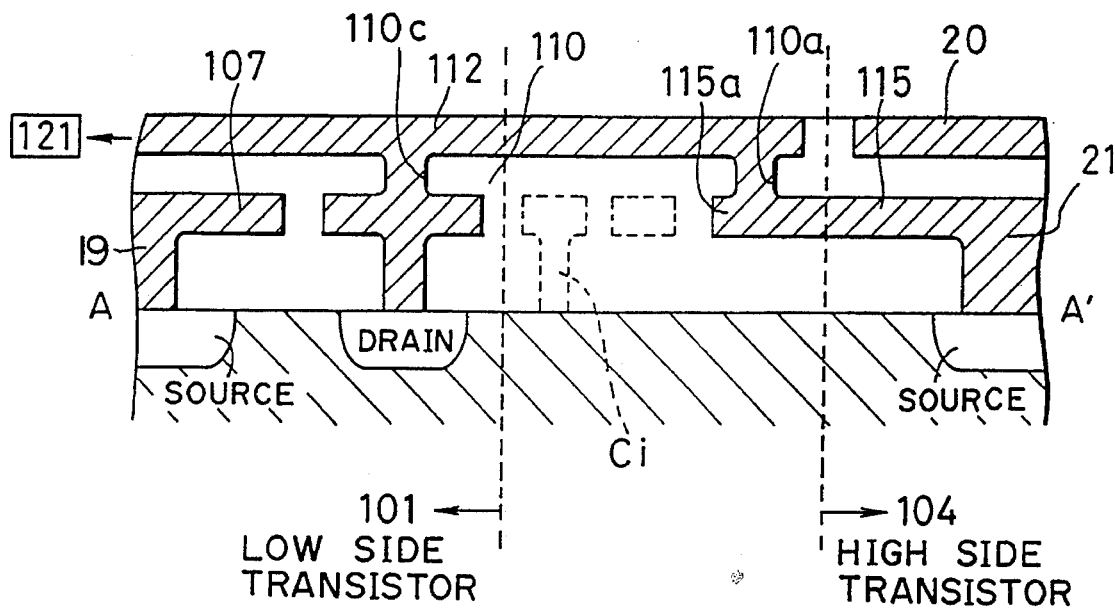
FIG. 6 is a schematic cross sectional view showing the high-current IC shown in FIG. 5 taken along the line A—A' in FIG. 5.
Figure 7:
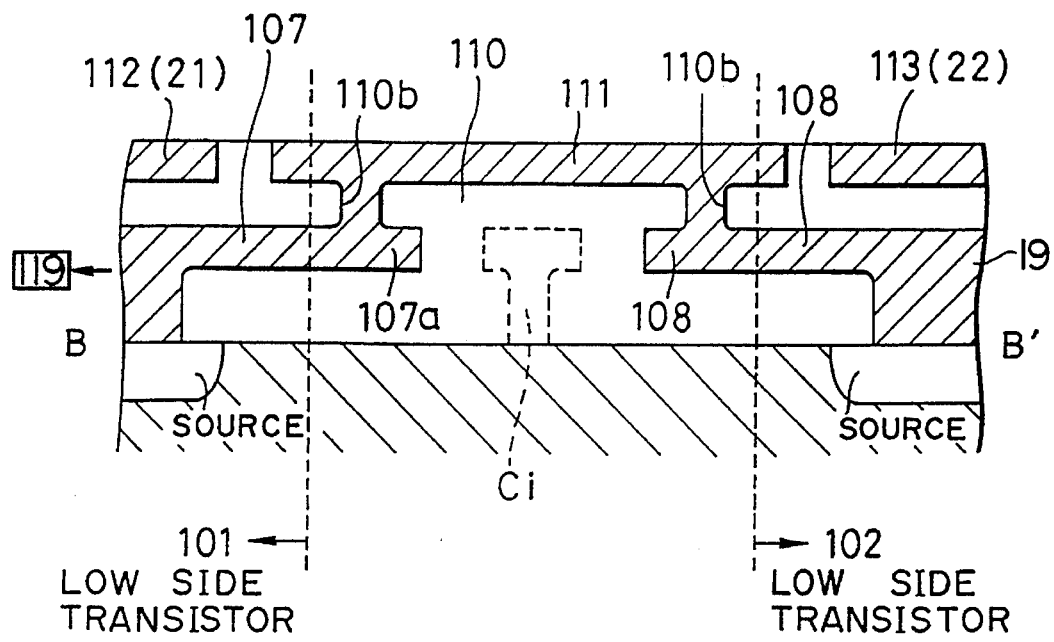
FIG. 7 is a schematic cross sectional view showing the high-current IC shown in FIG. 5 taken along the line B—B' in FIG. 5.

FIG. 6 shows a schematic cross sectional view of the IC shown in FIG. 5 taken along the line A—A' in FIG. 5. In FIG. 6, a wiring conductor 21 for the first phase output is arranged in the row direction and is conductively connected to the drain regions of first phase low side transistor 101 and to the source regions of first phase high side transistor 104. Wiring conductor 21 is provided with a pad 121 for the first phase output at the edge thereof. Wiring conductors 22 and 23 for the second or third phase outputs are likewise arranged in the row direction. Wiring conductors 22 and 23 are respectively connected to the drain regions of the second and third phase low side transistors 102 and 103 and to the source regions of the second and third phase high side transistors 105 and 106. Wiring conductors 22 and 23 are also respectively provided with pads 122 and 123 for the second and third phase outputs at the edges thereof. FIG. 7 shows a schematic cross sectional view of the IC shown in FIG. 5 taken along the line B—B' in FIG. 5. In FIG. 7, a low side common terminal wiring conductor 19 extending in the column direction is connected to the source regions of each first to third phase low side transistor 101 to 103. As is shown in FIG. 5, the wiring conductor 19 is provided with a pad 119 for the low side common terminal at the edge thereof. Furthermore, a high side common terminal wiring conductor 20 is arranged in the column direction and is connected to the drain regions of each first to third phase high side transistor 104 to 106. The wiring conductor 20 is provided with a pad 120 for the high side common terminal at the edge thereof.

Wiring conductor 21 for the first phase output comprises a layer 112 for the first phase low side output and a layer 115 for the first phase high side output. Layer 112 for the first phase low side output is formed on the upper side of interlayer insulation film 110, is conductively connected to pad 121 for first the phase output, and is conductively connected to each drain region of first phase low side transistor 101 through a connecting hole 110c formed through interlayer-insulation film 110 and through lower side (metal) wiring as will be described. Layer 115 for the first phase high side output is formed on the lower face of interlayer insulation film 110 and is conductively connected to the source regions of first phase high side transistor 104. Layer 115 extends out over first phase high side transistor 104 and projects towards first phase low side transistor 101. A connecting hole 110a is formed through a portion of interlayer insulation film 110 just above a projecting region 115a of layer 115 which is in the vicinity of first phase high side transistor 104. Layer 112 for the first phase low side output is conductively connected to layer 115 for the first phase high side output through a connecting hole 110a.

In the same manner, the wiring conductor 22 for the second phase output comprises a layer 113 for the second phase low side output and a layer 116 for the second phase high side output, while the wiring conductor 23 for the third phase output comprises a layer 114 for the third phase low side output and a layer 117 for the third phase high side output. Layers 113 and 114 for the second and third phase low side outputs are formed on the upper face of interlayer insulation film 110 and are respectively connected to pads 122 and 123 for the second and third phase outputs and to the drain regions of second and third phase low side transistors 102 and 103. Layers 116 and 117 for the second and third phase high side outputs are formed on the lower face of interlayer insulation film 110. Furthermore the layers 116 and 117 are respectively connected to the source regions of second and third phase high side transistors 105 and 106, extend out over second and third phase high side transistors 105 and 106, and project towards second and third phase low side transistors 102 and 103. These layers 113 and 114 for the second and third phase low side outputs and wiring layers 116 and 117 for the second and third phase high side outputs are conductively connected to one another through connecting holes 110a formed through interlayer insulation film 110 in the vicinity of second and third phase high side transistors 105 and 106, as in the connecting structure used in wiring layer 21 for the first phase output.

Moreover, low side common terminal wiring conductor 19 comprises a first phase low side common terminal layer 107 which is formed on the lower face of interlayer insulation film 110 and which is conductively connected to pad 119 and to the source regions of first phase low side transistor 101 through a connecting hole 110c formed through interlayer insulation film 110; a second phase low side common terminal layer 108 which is formed on the lower face of interlayer insulation film 110 and which is conductively connected to the source regions of second phase low side transistor 102 through a connecting hole 110c formed through interlayer insulation film 110; and a third phase low side common terminal layer 109 which is formed on the lower face of interlayer insulation film 110 and which is conductively connected to the source regions of third phase low side transistor 103 through a connecting hole 110c formed through interlayer insulation film 110. In this connection, each of the first to third phase low side common terminal layers 107 to 109 is formed in such a manner that it projects towards each corresponding, neighboring low side transistor. Further, first phase low side common terminal layer 107 and second phase low side common terminal layer 108 are conductively connected and crosslinked to one another through a layer 111, which is connected downwardly through connection holes 110b which are formed through interlayer insulation film 110 and which are positioned just above projecting regions 107a and 108a, as seen from FIG. 7. In the same way, second phase low side common terminal layer 108 is conductively connected to third low side common terminal layer 109 by a layer 111.

On the other hand, high side common terminal wiring conductor 20 is a wiring conductor for a power supply (not shown) and is integrally formed on the upper face of interlayer insulation film 110 as shown in FIG. 5 and FIG. 6. Wiring conductor 20 is connected to the drain regions of first to third phase high side transistors 104 to 106 through corresponding connecting holes (not shown) formed through interlayer insulation film 110.

In the wiring structure according to this embodiment, therefore, wiring conductors 21 to 23 for the first to third phase outputs constitute, on the regions for forming low side transistors 101 to 103, upper side or top layers, which cross the first to third phase low side common terminal layers 107 to 109 of low side common terminal conductor layer 19. On the other hand, these wiring conductors 21 to 23 for the first to third phase outputs constitute, on the regions for forming high side transistors 104 to 106, lower side or bottom layers, which cross the high side common terminal wiring conductor 20. As will be appreciated from FIG. 6, wiring conductors 21 to 23 for the first to third phase outputs are formed at the upper surface of interlayer insulation film 110 in the vicinity of the regions for forming the first to third phase low side transistors 101 to 103, and the lower or bottom portions of wiring conductors 21 to 23 only extend from connecting holes 110a adjacent to the regions for forming the first to third phase high side transistors 104 to 106 to the latter regions. In the region existing between the two neighboring transistor-forming regions, i.e., between the regions for forming the first to third phase low side transistors 101 to 103 and the regions for forming the first to third phase high side transistors 104 to 106, therefore, the bottom portions of the wiring conductors 21 to 23 are present in the region adjacent to the regions for forming the first to third phase high side transistors 104 to 106 and not in the region adjacent to the regions for forming the first to third phase low side transistors 101 to 103. As is shown with a dotted line in FIG. 6, an isolation contact Ci is formed between the neighboring regions for forming the first to third phase low side transistors 101 to 103 and for forming the first to third phase high side transistors 104 to 106. This results in a more reliable insulation-separation therebetween. Thus, the degree of freedom for the circuit design can be increased and accordingly, wiring for signals can, for instance, be formed between the transistor-forming regions in this embodiment of the high-current IC.

Moreover, the low side common terminal wiring conductor 19 serves, on the regions for forming the first to third phase low side transistors 101 to 103, as the bottom layer, which crosses with respect to the first to third phase low side output layers 112 to 114 of the first to third phase output wiring conductors 21 to 23. The first phase low side common terminal layer 107 is connected and crosslinked to the second phase low side common terminal layer 108 through a layer 111 formed on the surface of interlayer insulation film 110. The second phase low side common terminal layer 108 is also connected and crosslinked to the third phase low side common terminal layer 109 through a layer 111 formed on the surface of interlayer insulation film 110. For this reason, the bottom layers (first to third phase low side common terminal layers 107 to 109) are present only on and in the vicinity of the regions for forming the first to third phase low side transistors 101 to 103, but not between neighboring low side transistors.

Therefore, for instance, as shown with a dotted line in FIG. 7, an isolation contact Ci can be formed between the neighboring regions for forming low side transistors, i.e., below layer 111, which ensures that a more reliable insulation-separation is formed between these transistor-forming regions. Thus, the degree of freedom for the circuit design can be increased in this embodiment of the high-current IC.

In the wiring conductors 21 to 23 for first to third phase outputs, layers 112 to 114 are conductively connected to layers 115 to 117 on one side of the source regions of the first to third phase high side transistors 104 to 106. Here, in the case that the source areas are larger than the drain areas in the low side and high side transistors, the area for connection to the drains can be reduced and the area for connection to the sources can be increased by conductively connecting the source regions to the bottom layer, and by conductively connecting the drain regions to the top layer through the bottom layer and the through hole. In this construction, the low side output layer is formed at the top, and is conductively connected to the high side output layer (source) formed at the bottom through the through hole in the vicinity of the high side transistor.

On the contrary, in the case that the drain areas are larger than the source areas, the high side output layer (source regions) should be formed at the top, and conductively connected to the low side output layer (drain regions) formed at the bottom through a through hole in the vicinity of the low side transistor, this resulting in a reduction in the resistance of the low side wiring. As described above, the conductive layers for connection to the sources and the drains can be freely formed at either the top or the bottom.

In the foregoing embodiment, typical structures of a high-current IC according to the present invention have been explained. Therefore, for instance, the relative positions of the low side and high side transistors and the correspondence between the source and drain regions of these transistors and the common terminal wiring conductors or the layers for outputs are not restricted to specific ones and thus can be variously optimized depending on the applications of the high-current IC and structures of other circuits to be incorporated. Moreover, the use of the space between transistor-forming regions is likewise not restricted to a specific one and signal lines can, for instance, be added in addition to isolation contacts.

Figure 8:
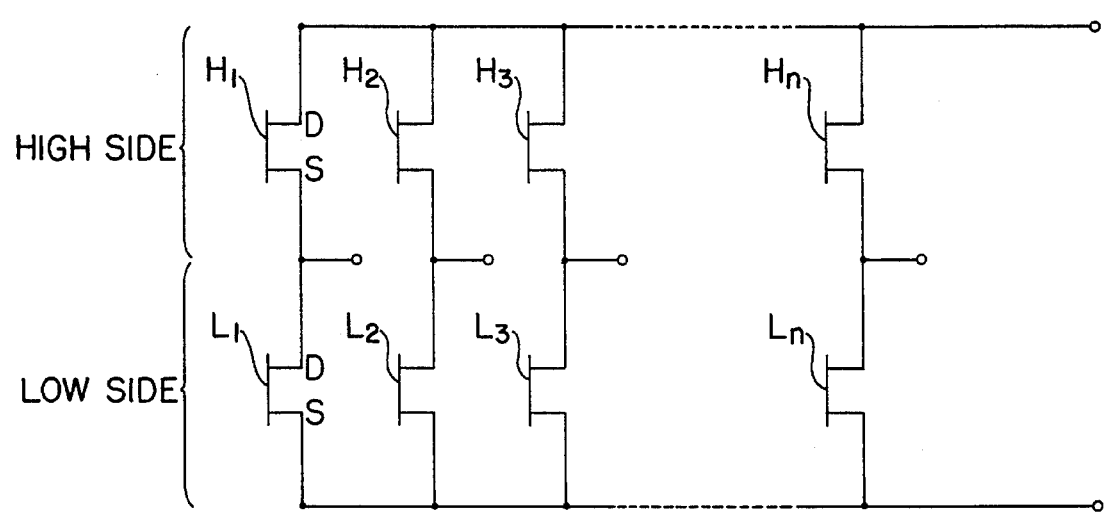
FIG. 8 is a circuit diagram showing an n phase half bridge circuit.
Figure 9:
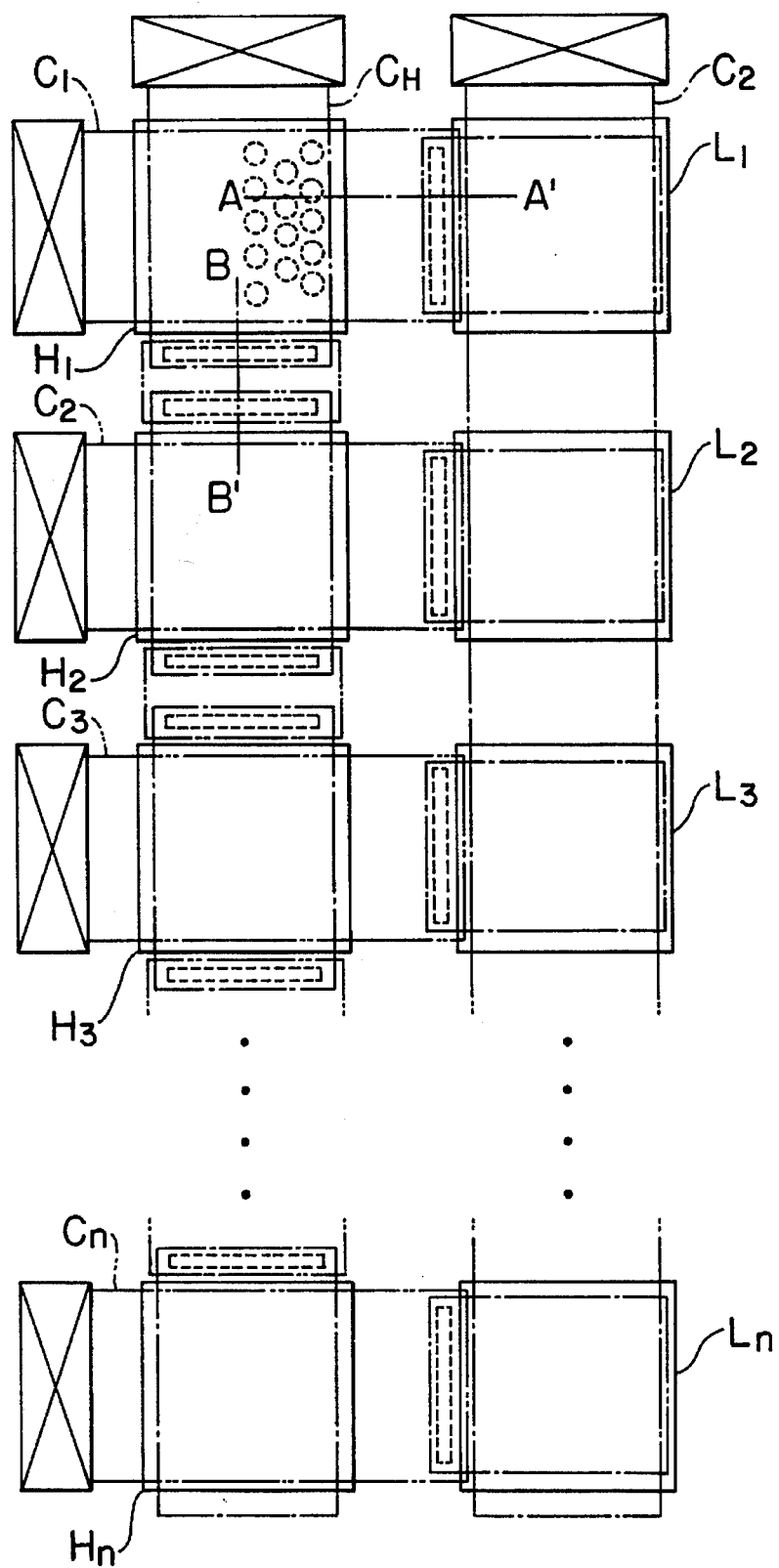
FIG. 9 is a schematic plan view of the circuit of FIG. 8.

It will be apparent to those skilled in the art that the arrangement shown in FIGS. 5–7 can readily be expanded to accommodate more than three phases. FIG. 8 is a circuit diagram of an n phase half bridge circuit, and FIG. 9 is a schematic plan view of the circuit. In FIG. 9, $H_1$, $H_2$, $H_3$, . . ., and $H_n$ refer to high side transistors, $L_1$, $L_2$, $L_3$, . . . , and $L_n$ refer to low side transistors, and $C_1$, $C_2$, $C_3$, . . . , and $C_n$ refer to wiring conductors for the first phase output, the second phase output, and so on to the n-th phase output. A low side common wiring conductor is marked by $C_L$ and a high side common wiring conductor is marked by $C_H$. The spatial arrangement of the top and bottom layers of the wiring conductors, at sectional lines A—A' and B—B' in FIG. 9, is the same as the depicted in FIGS. 6 and 7, respectively.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A high-current integrated circuit, comprising:

pairs of transistors formed in a surface of a semiconductor to provide an n-phase half bridge circuit having a high side and a low side, said pairs being n in number, each pair of transistors consisting of a high side transistor and a low side transistor, said pairs of transistors being arranged in a row direction, with said high side transistors being arranged in a column direction which is perpendicular to said row direction and with said low side transistors being arranged in said column direction;

an interlayer insulation film covering said transistors;

a wiring conductor for output formed for each phase of said half bridge circuit, said wiring conductor extending along the row direction over a respective pair of transistors and being conductively connected to electrode regions of the high side transistor and of the low side transistor of the respective pair transistors; and a high side common terminal wiring conductor and a low side common terminal wiring conductor extending along the column direction and being conductively connected to other electrode regions of said high side transistors and of said low side transistors, respectively;

wherein the wiring conductors for output and the high side and low side common wiring conductors form a crossed, multilayered wiring structure via the interlayer insulation film; and wherein one of the wiring conductor for output for a respective phase, the high side common terminal wiring conductor, and the low side common terminal wiring conductor is formed over one of two neighboring transistor-forming regions as an upper side conductive layer, while, over the other of the two neighboring transistor-forming regions, said one of the wiring conductor for output for a respective phase, the high side common terminal wiring conductor, and the low side common wiring conductor is formed as a lower side conductive layer and conductively connected to the upper side conductive layer through a connecting hole which is formed through the interlayer insulation film in the vicinity of the transistor-forming regions, said connecting hole having a width dimension and a depth dimension, the width dimension of said connecting hole being larger than the depth dimension.

2. The high-current integrated circuit as claimed in claim 1, wherein one of the remaining wiring conductors, from among the wiring conductor for output for a respective phase, the high side common terminal wiring conductor, and the low side common terminal wiring conductor, is formed as further lower side conductive layers over both of two neighboring transistor-forming regions, and wherein a conductive layer for connection is formed on the surface of the interlayer insulation film between these transistor-forming regions and the further lower side conductive layers are connected to the wiring layer for connection through connecting holes formed through the interlayer insulation film in the vicinity of the transistor-forming regions.

3. A high-current integrated circuit, comprising:

pairs of transistors formed in a surface of a semiconductor to provide an n-phase half bridge circuit having a high side and a low side, said pairs being n in number, each pair of transistors consisting of a high side transistor and a low side transistor, said pairs of transistors being arranged in a row direction, with said high side transistors being arranged in a column direction which is perpendicular to said row direction and with said low side transistors being arranged in said column direction;

an interlayer insulation film covering said transistors;

a wiring conductor for output formed for each phase of said half bridge circuit, said wiring conductor extending along the row direction over a respective pair of transistors and being conductively connected to electrode regions of the high side transistor and of the low side transistor of the respective pair of transistors; and a high side common terminal wiring conductor and a low side common terminal wiring conductor extending along the column direction and being conductively connected to other electrode regions of said high side transistors and said low side transistors, respectively;

wherein the wiring conductor for output and the high side and low side common wiring conductors form a crossed, multilayered wiring structure via the interlayer insulation film; and wherein one of the wiring conductor for output of a respective phase, the high side common terminal wiring conductor, and the low side common terminal wiring conductor is formed as lower side conductive layers over both of two neighboring transistor-forming regions, a wiring layer for connection being formed on the surface of the interlayer insulation film between these transistor-forming regions and being connected to the lower side conductive layers through connecting holes formed through the interlayer insulation film in the vicinity of the transistor-forming regions, each connecting hole having a width dimension and a depth dimension, the width dimension being larger than the depth dimension.

4. The high-current integrated circuit as claimed in claim 3, wherein one of the remaining wiring conductors, from among the wiring conductor for output for a respective phase, the high side common terminal wiring conductor, and the low side common terminal wiring conductor, is formed over one of two neighboring transistor-forming regions as an upper side conductive layer while, over the other of the transistor-forming regions, said one of the remaining wiring conductors is formed as a further lower side conductive layer and is connected to the upper side conductive layer through a connecting hole which is formed through the interlayer insulation film in the vicinity of one of the transistor-forming regions.

5. A high-current integrated circuit, comprising:

a substrate having a plurality of first transistors and a plurality of second transistors, the transistors being arranged in an array in which the first transistors are disposed in a first column, the second transistors are disposed in a second column, and each of said first transistors in the first column is disposed adjacent one of said second transistors in the second column to provide a plurality of transistor pairs which are disposed in rows, the columns extending in a column direction and the rows extending in a row direction; and means for forming a multi-phase half bridge circuit from the transistors, the means for forming including a first common terminal wiring conductor which extends in the column direction and which is connected to each of the first transistors, a second common terminal wiring conductor which extends in the column direction and which is connected to each of the second transistors, a plurality of phase output wiring conductors which extend in the row direction, each phase output wiring conductor being connected to the first and second transistors of a respective one of said pairs of transistors, and an interlayer insulation film which insulates the phase output wiring conductors from the first and second common terminal wiring conductors, wherein each phase output wiring conductor includes a first conductive layer over the first transistor of the respective pair and a second conductive layer over the second transistor of the respective pair, the respective first and second conductive layers being connected through a first connecting hole in the interlayer insulation film, wherein the first common terminal wiring conductor includes third conductive layers which are disposed between the first transistors and the respective first conductive layers of the phase output wiring conductors, and wherein the second common terminal wiring conductor includes fourth conductive layers which are disposed over the respective second conductive layers of the phase output wiring conductors.

6. The integrated circuit of claim 5, wherein all of the first and fourth conductive layers are disposed in an upper plane and all of the second and third conductive layers are disposed in a lower plane which is positioned between the upper plane and the substrate.

7. The integrated circuit of claim 5, wherein the first common terminal wiring conductor additionally includes fifth conductive layers which are disposed between the first transistors and which are connected to the third conductive layers of the first common terminal wiring conductor through second connecting holes in the interlayer insulation film.

8. The integrated circuit of claim 7, further comprising isolation contacts beneath the top conductive layers of the first common terminal wiring conductor.

9. The integrated circuit of claim 5, further comprising an isolation contact beneath the first conductive layers of the phase output wiring conductors.

10. The integrated circuit of claim 5, wherein the transistors are collective transistors.

11. A high-current integrated circuit, comprising:

a substrate having a plurality of first transistors and a plurality of second transistors, the transistors being arranged in an array in which the first transistors are disposed in a first column, the second transistors are disposed in a second column, and each of said first transistors in the first column is disposed adjacent one of said second transistors in the second column to provide a plurality of transistor pairs which are disposed in rows, the columns extending in a column direction and the rows extending in a row direction; and means for forming a multi-phase half bridge circuit from the transistors, the means for forming including a first common terminal wiring conductor which extends in the column direction and which is connected to each of the first transistors, a second common terminal wiring conductor which extends in the column direction and which is connected to each of the second transistors, a plurality of phase output wiring conductors which extend in the row direction, each phase output wiring conductor being connected to the first and second transistors of a respective one of said pairs of transistors, and an interlayer insulation film which insulates the phase output wiring conductors from the first and second common terminal wiring conductors, wherein the first common terminal wiring conductor includes bottom conductive layers which are disposed over the first transistors and top conductive layers which are disposed between the first transistors, the top and bottom conductive layers being connected through openings in the interlayer insulation film.

12. The integrated circuit of claim 11, wherein the phase output wiring conductors include first conductive layers which are disposed over the bottom conductive layers of the first common terminal wiring conductor, the first conductive layers of the phase output wiring conductors and the top conductive layers of the first common terminal wiring conductor lying in a common plane, the bottom conductive layers of the first common terminal wiring conductor being positioned between the common plane and the substrate.

13. The integrated circuit of claim 11, further comprising isolation contacts beneath the top conductive layers of the first common terminal wiring conductor.

* * * * *